US007067404B2

(12) United States Patent
Oana et al.

(10) Patent No.: US 7,067,404 B2
(45) Date of Patent: Jun. 27, 2006

(54) THIN FILM SEMICONDUCTOR DEVICE HAVING A GATE ELECTRODE INSULATOR FORMED THROUGH HIGH-HEAT OXIDIZATION

(75) Inventors: Yasuhisa Oana, Yokohama (JP); Masakiyo Matsumura, Yokohama (JP)

(73) Assignee: Advanced LCD Technologies Development Center Co., Ltd., Kanagawa-Ken (JP)

( * ) Notice: Subject to any disclaimer, the term of this patent is extended or adjusted under 35 U.S.C. 154(b) by 0 days.

(21) Appl. No.: 11/031,144

(22) Filed: Jan. 6, 2005

(65) Prior Publication Data

US 2005/0121111 A1    Jun. 9, 2005

Related U.S. Application Data

(62) Division of application No. 10/236,537, filed on Sep. 6, 2002, now abandoned.

(30) Foreign Application Priority Data

Sep. 10, 2001    (JP)    ............... 2001-317414

(51) Int. Cl.
*H01L 21/36*    (2006.01)
*H01L 21/20*    (2006.01)
(52) U.S. Cl. ................... 438/489; 438/150; 438/487
(58) Field of Classification Search ........ 438/482–491, 438/487, 166, 479, 502, 168, 586, 149, 150, 438/154, 489; 257/57, 61, 64–69, 334, 336, 257/437, 617
See application file for complete search history.

(56) References Cited

U.S. PATENT DOCUMENTS

| 5,512,494 A | * | 4/1996 | Tanabe | 438/161 |
| 6,222,253 B1 | * | 4/2001 | Sadana et al. | 257/617 |
| 6,458,636 B1 | * | 10/2002 | Yi et al. | 438/150 |
| 6,746,942 B1 | * | 6/2004 | Sato et al. | 438/586 |

FOREIGN PATENT DOCUMENTS

| JP | 5-267665 | * 10/1993 |
| JP | 2001-237430 | * 8/2001 |

* cited by examiner

*Primary Examiner*—Zandra V. Smith
*Assistant Examiner*—Khanh Duong
(74) *Attorney, Agent, or Firm*—Daniel M. Goldfisher; Clifford Chance US LLP

(57) ABSTRACT

A thin film semiconductor device includes a gate electrode insulator formed through high-heat oxidization of a semiconductor film. The high-heat oxidization of semiconductor film is carried out, in the process of crystallization or recrystallization of non-single-crystalline semiconductor thin film on a base layer, by irradiating predetermined areas of the thin film which is implanted with oxygen ion before irradiation, to convert such areas to oxidized areas, and these areas are processed to gate electrode insulators of electric circuit units in the thin film semiconductor device.

6 Claims, 5 Drawing Sheets

THIN FILM SEMICONDUCTOR DEVICE HAVING A GATE ELECTRODE INSULATOR FORMED THROUGH HIGH-HEAT OXIDIZATION

This application claims the benefit of the filing date of Japanese patent application serial number 2001-317414 entitled "A Thin Film Semiconductor Device Having A Gate Electrode Insulator Formed Through High-Heat Oxidization" which was filed on Sep. 10, 2001. This application is a divisional of U.S. Ser. No. 10/236,537, filed on Sep. 6, 2002 now abandoned.

BACKGROUND OF THE INVENTION

The present invention relates to a thin film semiconductor device and a semiconductor substrate sheet to be used in the semiconductor device as well as a method for producing them.

As is well known, a thin film semiconductor device (also known as a thin film transistor (TFT) device) is formed on a semiconductor substrate, which typically consist of a thin film layer of semiconductor material, such as silicon, over a base layer of insulation material, such as non-alkaline glass, or quarts glass. In the thin film layer of the semiconductor, a plurality of channels consisting of a source area and a drain area are formed, and each of channels is equipped with a gate electrode separated by an insulating film from the above areas.

In a typical thin film semiconductor device, a gate electrode insulator is interposed between the gate electrode and the channel area. This insulator is usually formed with a film of silicon oxide, and this film is typically required to be formed at a low temperature. To form this silicon oxide film in a TFT, high temperature silicon oxide film formation techniques such as those used in large scale integration (LSI) semiconductor processes (which may require temperatures of more than 900° C.) typically cannot be used. Instead, a relatively low temperature deposition process (e.g., a temperatures less than 600° C.), such as one using a plasma CVD method, is used.

Although an oxidized film deposited by the plasma CVD method can be used to form an insulator film for a TFT, it may have disadvantages in insulation property and/or stability compared with a film oxidized at a high temperature. This occurs because, when using the plasma CVD-method, some impurities remain between the channel area and the gate insulator film, and further, the resultant silicon oxide film has a tendency to be composed of compounds as which do not have a stoichiometrically regulated composition of "$SiO_2$" but, instead, have an irregular composition such as "$SiO_{1.9}$". When an oxidized film having such characteristics is used as a gate electrode insulator of a TFT, the TFT circuit tends not only to have greater variance of threshold voltage values, but also have reduced long-term stability of TFT properties. For example, in conventional products, variation of TFT threshold voltage values may be in the ±0.4V range and the magnitude of this variation may increase over time.

Furthermore, in conventional thin film semiconductor devices using poly-crystalline silicon, disadvantages due to the small size of crystal grains and the irregularity of configuration mode of crystal grains are inevitable. That is, as a poly-silicon film is composed of a numerous crystal grains of extreme small size, the improvement of mobility is limited due to such phenomenon as dispersion of electrons or holes at boundaries between crystal grains at the time of operation of the device.

Attempts have been made to use relatively large grain size polycrystalline silicon in order to avoid or minimize disadvantages such as electron dispersion while simultaneously maintaining high electron mobility. For example, thin film layers having semiconductor grains of about 1 µm size and having a mobility of about 100 $cm^2$/V sec. have been formed by annealing a layer of polycrystalline silicon in a high temperature furnace. However, high temperature annealing (e.g., over 1000° C.) is used in this process, and this requires the use of expensive quartz glass sheets instead of relatively inexpensive sodium glass sheets. A substrate using such expensive materials is not suited for cost-effective production of a device using a large substrate, such as a TFT LCD display screens.

Other processes to obtain a thin layer film of polycrystalline semiconductor having large size grains have been proposed. These methods include irradiating a thin film of amorphous or polycrystalline semiconductor with an energy beam (such as an excimer laser) instead of using high temperature annealing. By this irradiation method, it is possible to enlarge the size of a crystal grain using relatively inexpensive glass sheets as the base layer. However, even excimer laser irradiation is used, the size of obtained crystal grain generally does not exceed 1 µm. Furthermore, this excimer laser process can cause unevenness of grain size. Incidentally, the grain size can be determined by "(the maximum diameter of a grain+the minimum diameter of the grain)÷2" and such diameters can be measured through SEM observation of crystal grains which remains after etching the film by Secco etching process.

Furthermore, there is a problem on the configuration of crystal grains in a thin film formed using the conventional excimer laser process. Namely, in the conventional polycrystalline semiconductor thin film, configuration of crystal grains in the two dimensional direction may be highly random. The random configuration of crystal grains, and the non-uniformity of grain size, may cause serious difficulty in forming TFT devices. Such difficulties may occur because electron mobility may fluctuate when a device is formed traversing the border of crystal grains and, therefore, it is difficult to integrate TFT circuits having different channel lengths.

Accordingly, many TFT on the market, in which polycrystalline semiconductor film are used, are designed so that one circuit extends so as to contain at least several boundaries of crystal grains as mentioned in FIG. 7, in order to reduce the variation of mobility. In such devices, the average mobility cannot exceed 150 $cm^2$/V·sec.

SUMMARY OF THE INVENTION

In general, in one aspect, implementations of the invention can provide a thin film semiconductor device (i.e., a TFT), and a substrate sheet to be used in forming the TFT device, wherein the chemical connection between the semiconductor film and the gate electrode insulator film are successive through border faces, and the gate electrode insulator film has a stoichiochemical composition of $SiO_2$. In forming such a device, disadvantages of conventional TFT produced by CVD methods can be avoided. Further, the disclosed method of device formation can reduce greatly the variety of threshold value and maintain stable operating characteristics.

In general, in another aspect, implementations of the invention can provide a thin film semiconductor device and its substrate sheet in which an electric circuit module can be fashioned so as to avoid the need for arrangement of the device over many crystal grains of various sizes and of disordered configuration, but rather, the device can be arranged to have a configuration corresponding to the arrangement of crystal grains.

Implementations can include features such as a thin film semiconductor device that can work stably for a long time with desirable operating properties and with reduced fluctuation in operational threshold values. This can be provided when a partial region in the thickness direction of the thin film of semiconductor, after being converted to an oxidized film through irradiation of energy beam, is used as the gate electrode insulator of the device. In some implementations, a thin film semiconductor device can have a structure in which unit circuits are arranged to correspond to the arrangement of crystal grains. This may be implemented when the above-described substrate sheet is produced such that single-crystalline semiconductor grains are arranged in a substantially geometric and regular arrangement.

Implementations can include a substrate sheet that comprises a thin film semiconductor having a layer of semiconductor crystal grains formed by crystallization (and/or recrystallization) of a non-single-crystalline semiconductor layer and of a layer of oxidized film formed by oxidization of a non-single-crystalline semiconductor layer. The layer of semiconductor crystal grains may have a configuration in which single crystalline semiconductor grains are arranged in a regular arrangement.

Implementations of the thin film semiconductor device can include a layer of semiconductor crystal grains and a layer of oxidized film formed by oxidization of non-single-crystalline semiconductor layer, and the oxidized film layer can be used as the insulator for the gate electrode. Preferably, the layer of semiconductor crystal grains has a composition in which single-crystalline semiconductor grains are arranged in a regular arrangement (i.e., an arrangement having a predictable crystalline structure).

In one implementation, the method for producing a substrate sheet for thin film semiconductor devices includes the steps of: (a) depositing a layer of non-single-crystalline semiconductor on a base layer of insulation materials, (b) forming oxygen implanted areas in the non-single-crystalline semiconductor layer by implanting oxygen ions into the layer and (c) irradiating the layer with an energy beam. The energy bean changes the layer of non-single-crystalline semiconductor such that the oxygen implanted areas are converted to insulating oxidized films, and other areas are converted to films of semiconductor crystal grains. It is preferred that the irradiation by the energy beam be carried out so that areas in which the irradiation intensity are maximum, and areas in which the irradiation intensity are minimum are arranged such that the transition of irradiation intensity between the above two areas is successive.

Another method for producing a thin film semiconductor device can include steps of: (a) depositing a layer of non-single-crystalline semiconductor on a base layer of insulation materials, (b) forming oxygen implanted areas in the layer of the non-single-crystalline semiconductor by implanting oxygen ion into the layer, (c) irradiating the layer with an energy beam, thereby changing the layer of non-single-crystalline semiconductor such that the oxygen implanted areas are converted to insulating oxidized films and other areas are converted to films of semiconductor crystal grains, (d) forming a gate electrode by using the insulating oxidized films as a gate insulator and, (e) completing an electric circuit unit by forming a source electrode and a drain electrode in the layer of semiconductor crystal grains. It is preferred that the irradiation of energy beam is carried out so that areas at which the irradiation intensity are maximum and areas at which the irradiation intensity are minimum are arranged in a regulated mode and transition of irradiation intensity between the above two areas is successive.

DETAILED DESCRIPTION OF THE INVENTION

Figure 1A:
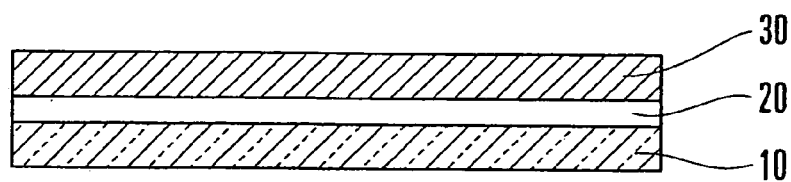
FIG. 1 is pattern diagrams showing steps of one embodiment of the process according to the present invention for manufacturing a thin film semiconductor device.
Figure 1B:
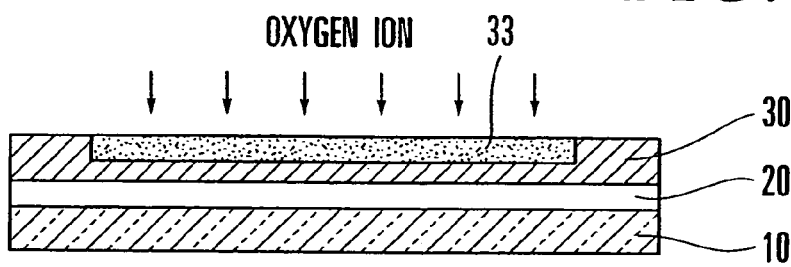

To form the thin film semiconductor device of the present invention, it is preferred to use a glass sheet having a strain point not exceeding 700° C. as the material forming the base layer of a substrate sheet. But, it is possible to use various kinds insulation materials other than glass, for example, ceramics or plastic films having appropriate heat resistance.

On the above base layer, the single crystalline semiconductor film, in which an oxidized insulation film located on top of a single-crystalline film, or in an intermediate portion of the film in the thickness direction of the single crystalline film, is formed. This semiconductor thin film can be produced by implanting oxygen ions into a non-single-crystalline semiconductor film deposited on a base layer, and then irradiating the layer with an energy beam (such as that produced by an excimer laser). This irradiation procedure can be used to change the non-single-crystalline semiconductor film to a semiconductor film composed of an oxidized film and a layer of single-crystalline grains having a relatively large size. In forming the non-single-crystalline semiconductor, an amorphous semiconductor or poly-crystalline semiconductor, in which small size crystal grains are already formed, can be used. In using the latter, the poly-crystalline semiconductor is changed to a semiconductor film by implantation of oxygen ions and recrystallization. The thickness of the amorphous semiconductor film is preferred to be 30 through 300 nm, especially 30 through 200 nm.

When the non-single-crystalline semiconductor layer is formed on the base layer, a thin control layer (a "first control layer") for adjusting heat conduction and crystallization is formed between the base layer and the semiconductor layer. The first control layer may be formed from materials such as silicon oxide or silicon nitride (SiNx). The first control layer functions to block the diffusion of impurities (such as glass components) from the base layer into the semiconductor layer, and also functions to increase uniformity of heat distribution in the semiconductor layer. This uniformity is effected by controlling the orientation of crystallization. The thickness of the first control layer can be between 20 nm and 1000 nm, with a preferred range of 200 nm to 300 nm.

A second control layer may then be formed on top of the first control layer. This second control layer has a function similar to that of the first control layer, namely, to effect uniformity of heat distribution and to control the orientation of crystals in the semiconductor layer in the process of crystallization by irradiation. Materials such as silicon-oxide, silicon-nitride, silicon-ox-nitride or silicon-carbonate (SiC) can be used for the second control layer. The thickness of the second control layer can be between 50 nm and 500 nm, with a preferred range of 100 nm to 300 nm.

In some cases, a thin film semiconductor layer may be formed between the two control layers. In these cases, the material of the first control layer is first deposited as a thin film on the base layer of insulation material. Following this, the thin film of non-single-crystalline semiconductor is deposited on the first control layer, and then the second control layer is deposited on the thin film semiconductor layer. Thereafter, the irradiation of energy beam from the upper direction is carried out to crystallize (or recrystallize) the layer of non-single crystalline material.

FIGS. 1(a) through 1(e) show semiconductor layers formed at various process stages from deposition on a base layer to completion of a thin film semiconductor device. In this embodiment, oxygen ions are implanted into the top surface of non-single-crystalline semiconductor layer.

Figure 1C:
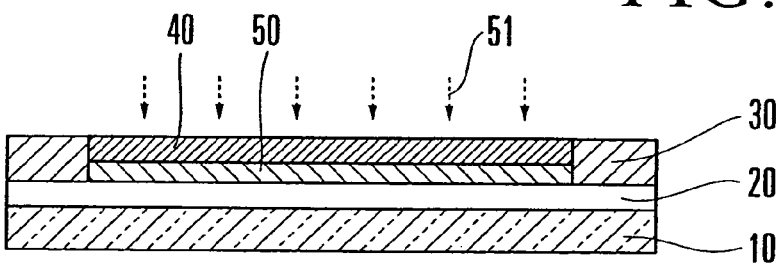
Figure 1D:
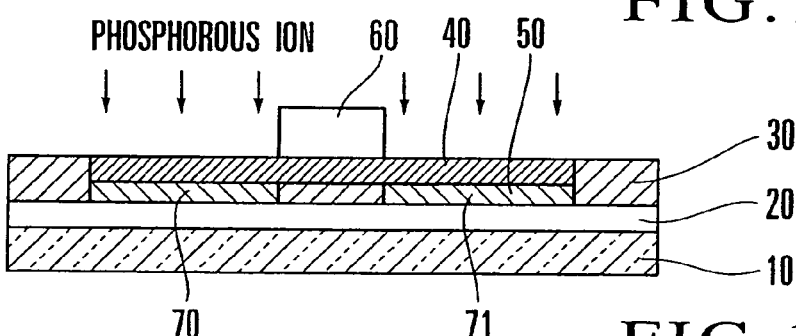
Figure 1E:
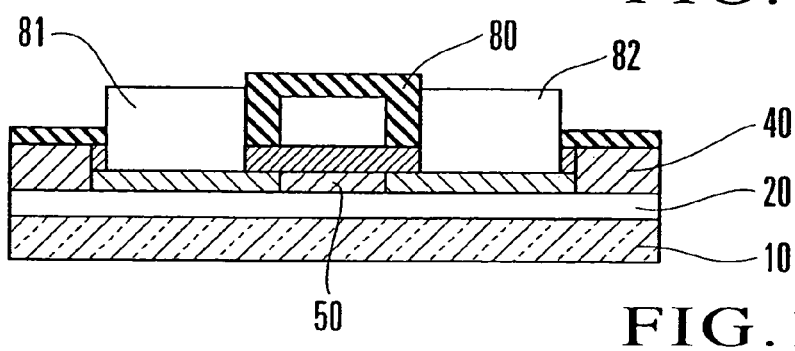
Figure 2A:
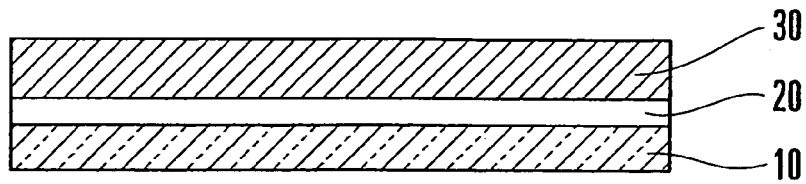
FIG. 2 is pattern diagrams showing steps of another embodiment of the process according to the invention for manufacturing a thin film semiconductor device.
Figure 2B:
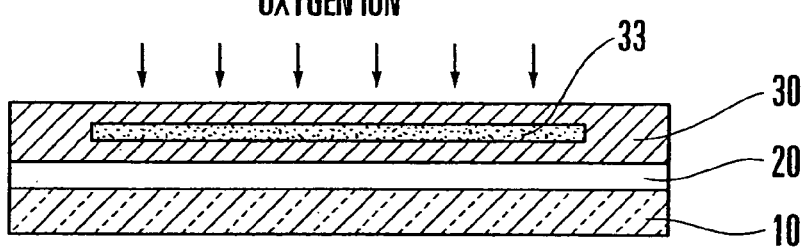
Figure 2C:
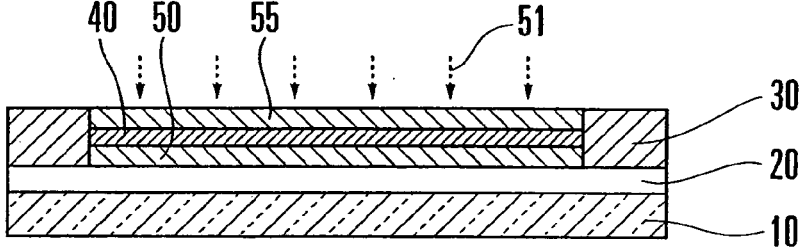
Figure 2D:
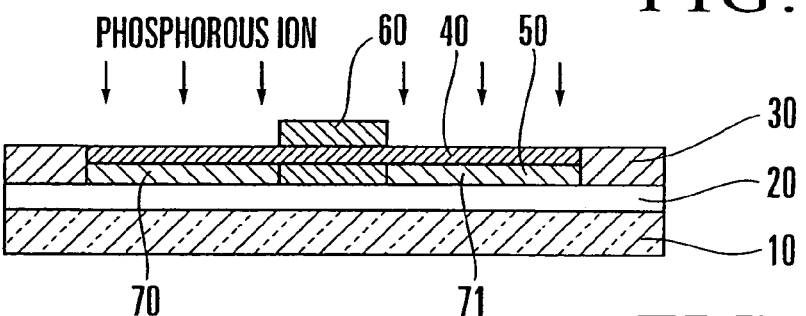
Figure 2E:
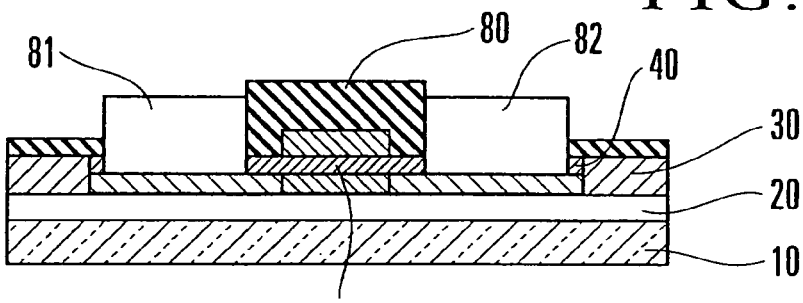

Referring to FIG. 1(a), the first control layer 20 for heat conduction and crystallization is deposited on the glass base layer 10, and a non-single-crystalline semiconductor layer 30 is deposited thereon. Next, oxygen ions are implanted into a predetermined area to form an oxygen implanted area 33 (see FIG. 1(b)). The predetermined area 33 is then irradiated with an energy beam to form an oxidized layer 40 (see FIG. 1(c)). The layer 40 can be formed through high-heat oxidation of the oxygen implanted area 33 by an energy beam. This process also results in a single-crystalline semiconductor grain layer 50 which is formed through single-crystallization of non-single-crystalline layer 30. The area which is not irradiated by energy beam remains as a non-single-crystalline area 30. FIGS. 1(c) and 1(d) show the sectional view of a single area of single-crystalline grains layer; an actual substrate sheet has a plurality of such oxidized area and single-crystalline grains area.

Next, the gate electrode 60 is formed on the oxidized layer 40) (which has been formed by irradiation of energy beam) using the layer 40 as the gate electrode insulator (see FIG. 1(d). Then source area 70 and drain area 71 are formed by implanting a material to form an electrode (such as phosphorous ion), into single-crystalline semiconductor layer 50 using gate electrode 60 as a mask. Following this, a film 80 of insulation material (such as silicon oxide) is deposited so as to surround the upper side and the lateral side of gate electrode 60 (see FIG. 1(e)). Then, after forming contact holes in insulating film 80 at the positions corresponding to source area 70 and drain area 71, source electrode 81 and drain electrode 82 are formed by depositing material such as aluminum to form an electrode; thus completing the thin film semiconductor device.

FIG. 2(a) through FIG. 2(e) are pattern diagrams showing an embodiment in which oxygen ions are implanted into an intermediate layer portion of a non-single semiconductor layer.

In the FIG. 2 embodiment, the deposition of the first control layer for heat-conduction and the non-single semiconductor layer in the step (a) can be carried out in substantially the same way as for the embodiment of FIG. 1. However, the implantation of oxygen ions is made into the intermediate layer portion of the non-single-crystalline semiconductor layer 30, and therefore, the oxygen implanted area 33 is formed in a intermediate region in the thickness direction of the non-single semiconductor layer. After formation of oxygen implanted layer 33, in the step (c), the layer 33 is converted to oxidized film layer, and non-single-crystalline semiconductor areas located at the upper-side and under-side of the oxygen implanted area are converted to single-crystalline semiconductor layers. Next, as shown in FIG. 2(d), the predetermined areas of the upper-side single-crystalline layer is formed as the gate electrode 60 by the patterning process. The process used in step 2(e) is substantially identical to that of step 1(e) in FIG. 1.

The volume of oxygen ion (dose) and its implanting depth (Rap) may be determined according to the thickness or position of the oxidized insulation layer 30. It is noted that irradiation by an energy beam is not be limited to the use of excimer laser. For example, an argon laser radiated continuously can be used by pulsating or scanning it.

To obtain a thin film semiconductor layer in which single crystalline semiconductor grains are arranged in a regulated alignment mode by irradiation of energy beams, the irradiation should be carried out such that irradiation energy intensity changes in two-dimensional directions between the maximum value and the minimum value at predetermined intervals, and maximum points and minimum points appear one after another in a regular order. In other words, the irradiation should be carried out so that irradiated points to which maximum irradiation intensity is given and irradiated points to which minimum irradiation intensity is given are arranged in a regulated configuration such as a matrix-arrayed configuration.

Figure 3:
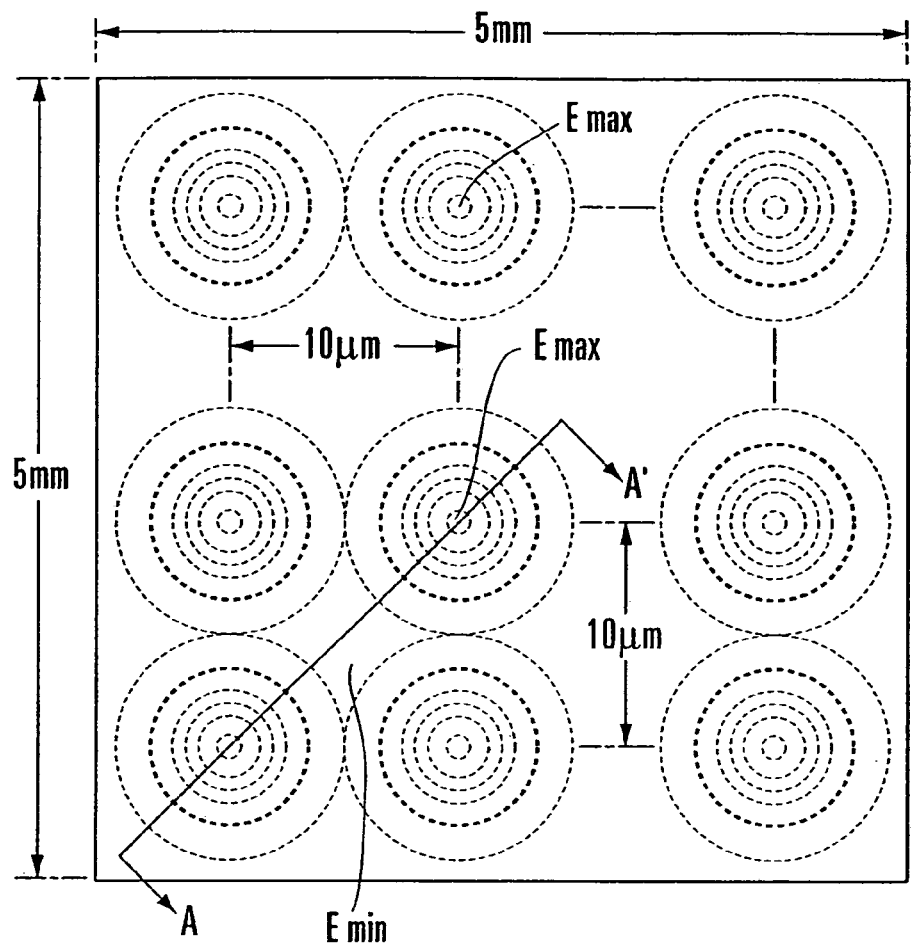
FIG. 3 is a pattern diagram for illustrating one embodiment of distribution of energy beam intensity in two-dimensional directions in the irradiation step according to the process of the present invention.
Figure 4:
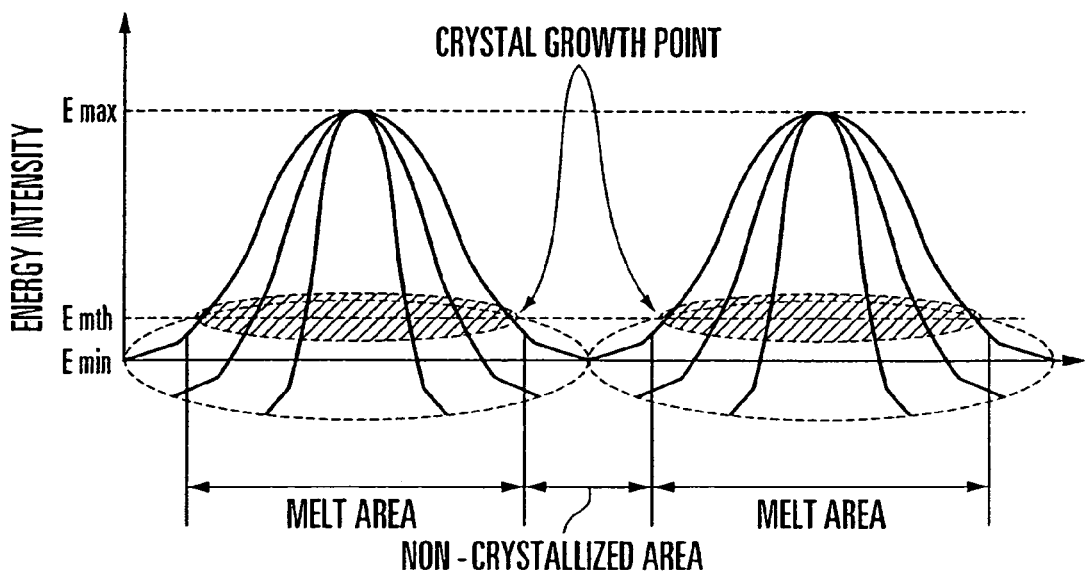
FIG. 4 is a pattern diagram illustrating a profile of transition of energy beam intensity between a maximum value and minimum value in the process according to the present invention, being shown as a sectional view along the arrow-mark in FIG. 3.

For example, as shown in FIGS. 3 and 4, the irradiation is carried out in a repeating energy level pattern such as the pattern "maximum value (Emax) followed by minimum value (Emin) followed by maximum value(Emax)." This changing pattern occurs two-dimensionally (i.e., along both the 'x' and 'y' axes). For example, this may be repeated across a rectangle region of 5×5 mm, at every intervals of 10 μm. Further, to irradiate the entire surface, the irradiated area (for example, the above square area of 5 mm×5 mm) may be shifted periodically in either 'x' direction or 'y' direction at a predetermined pitch.

This change of irradiation energy intensity can be realized by bringing the variation to the irradiation energy intensity distribution using a phase shift mask. Furthermore, it is desirable that the change between the maximum value and the minimum value be a successive change substantially as shown in FIG. 4.

Determination of the magnitude of the maximum value and the minimum value energy levels may be based on the film thickness of the non-singular-crystalline semiconductor layer and the thermal conductivity of the first and the second control layers. For example, the minimum energy intensity may be determined to be an intensity at which the thin film semiconductor doesn't melt during the irradiation, and the maximum value may be an intensity sufficient to melt the thin film semiconductor during the irradiation. A melting threshold level (Emth) should be positioned between the maximum value (Emax) and the minimum value (Emin), as shown in the FIG. 4.

The face shape of the irradiation beam is not limited to a square shape of 5×5 mm as mentioned above, and may be various polygon shapes. Further, the arrangement mode of maximum value points and minimum value points is not limited to the rectangular lattice. Other shapes, such as delta shaped lattice, also can be used.

Figure 5:
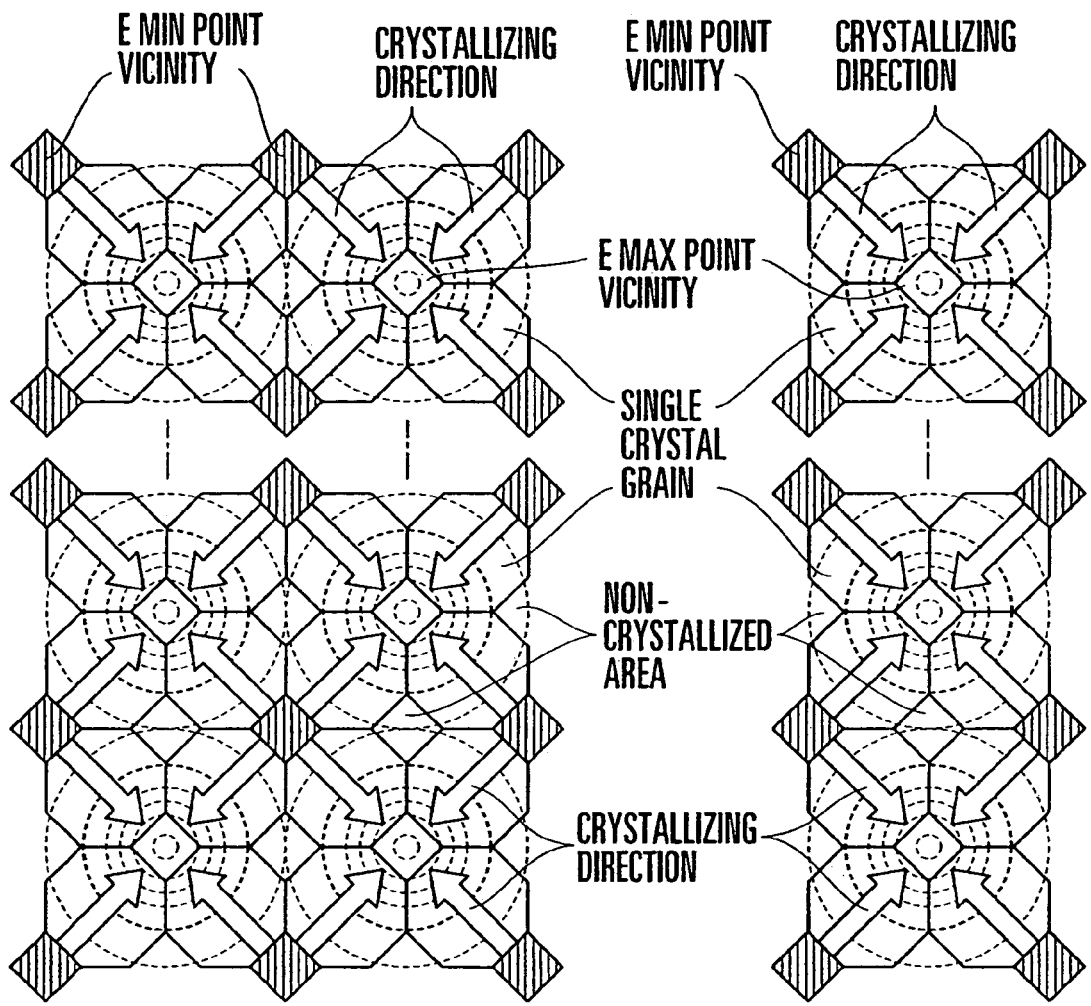
FIG. 5 is a pattern diagram illustrating an alignment state and growth direction of single crystalline grains during and after the irradiation of energy beam in the process according to the present invention.

By carrying out the irradiation of energy beam to the semiconductor film in the manner disclosed herein, the semiconductor layer does not completely melt in the minimum irradiation energy areas (namely, areas to which irradiation energy less than threshold value are given), and fine crystals of semiconductor are produced in the areas near the threshold value areas. Some of these fine crystals functions as cores for crystallization and the crystallization progresses dimensionally from the points of these cores towards the areas to which maximum irradiation energy are given (i.e., in the direction of arrow marks in FIG. 5). In the areas near where the minimum threshold value energy is given, at the same time as formation of the fine crystal grains, two atoms of oxygen and one atom of silicon are bonded chemically and the formation of a SiO2 layer starts. The growth of this layer also proceeds horizontally with the progress of crystallization of melted silicon.

In the areas in which the temperature of semiconductor film is highest (corresponding to areas receiving the highest irradiation energy and, correspondingly, to the areas in which the horizontal growth of crystallization proceeds), a plurality of crystals which have different or crossed crystallization growth direction collide with one another, and their contacting areas form the area of fine crystals or the borderline of crystals. Thus, when the energy beam which has a energy intensity distribution as shown in FIGS. 3 and 4 is irradiated, a substrate for thin film semiconductor devices can be obtained in which single-crystalline grains having the size of over 4 μm and covered with insulation film surface are arranged in a regulated mode. The maximum size of the crystal grains can be adjusted by adjusting intervals between maximum irradiation energy points. Further, by varying the amount of oxygen ion to be implanted or by changing the position of implantation, the thickness and position (for example, at the surface area or inside area) of oxidized layers can be varied.

Following this process, electrode materials (such as Molybdenum-Tungsten alloy (MoW)) is deposited on the single crystalline grain layers of the thin film semiconductor substrate. The electrode layer forms a gate electrode and has a thickness of, e.g., 300 nm. Then, a source area and a drain area are formed using the gate electrode as the implantation mask, followed by formation of an isolating interlayer with insulation materials such as silicon oxide (which covers the gate electrode). Further, contact holes are formed by perforating through the second control layer at the position above the source area and the drain area, and electrode materials, such as Aluminum/Molybdenum, is deposited and patterned in the contact hole.

Figure 6:
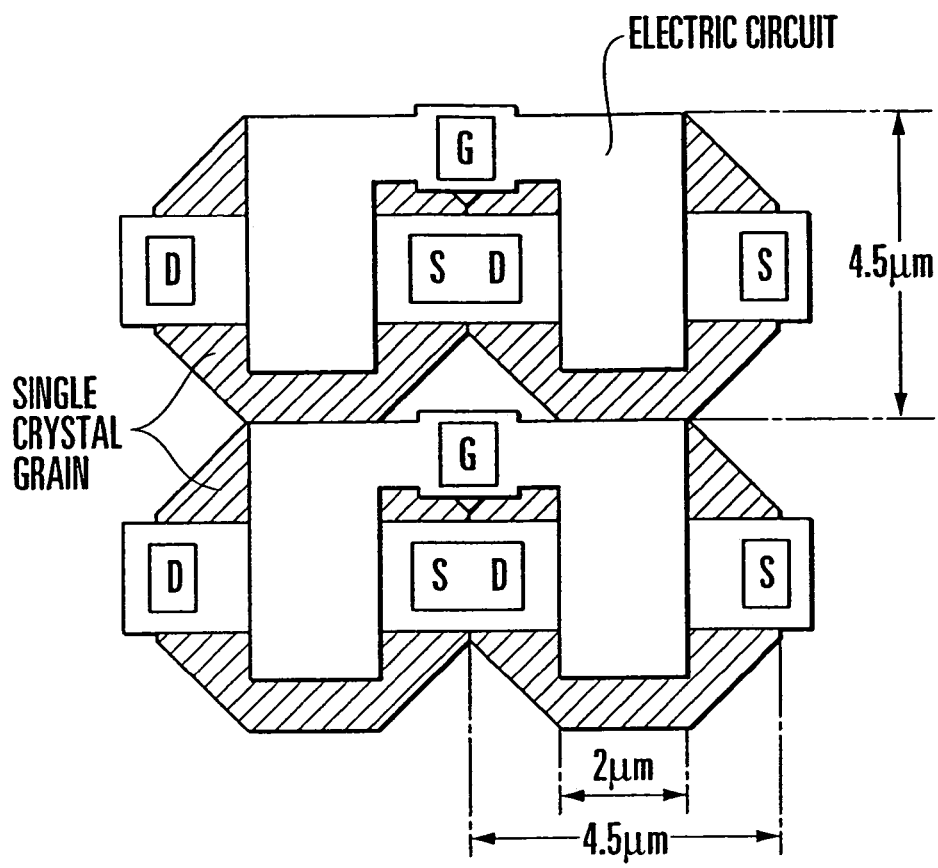
FIG. 6 is the pattern diagrams illustrating one embodiment of the positional relationship of electrodes with crystal grains in the thin film semiconductor device of the present invention.
Figure 7:
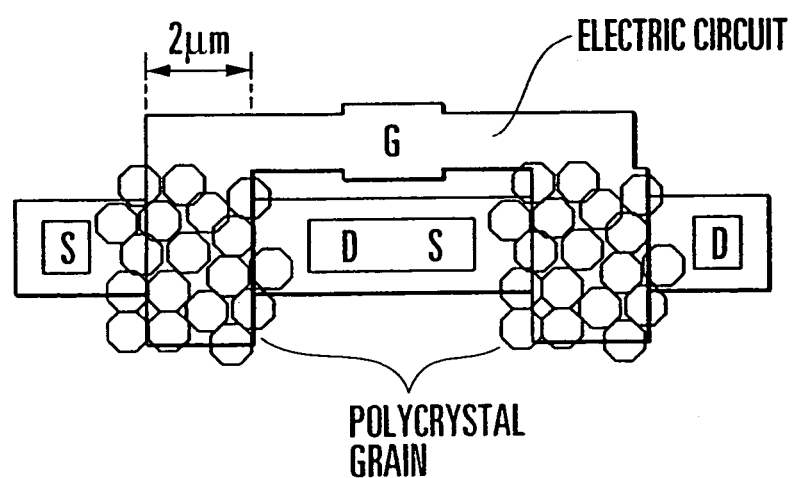
FIG. 7 is a pattern diagram illustrating one embodiment of the positional relationship of electrodes with crystal grains in a thin film semiconductor device using a conventional thin film of polycrystalline semiconductor.

Thus, as shown in (a) and (b) of FIG. 6, a thin film semiconductor device in which one unit electric circuit is arranged in each of a single crystal can be obtained. A thin film semiconductor device of this type can have a high mobility (for example, over 300 $cm^2$/V·sec) exceeding the mobility of conventional devices in which a substrate sheet comprising polycrystalline semiconductor film is used.

When an oxidized film is formed by implantation of oxygen ions into non-single crystalline semiconductor layer together with high-heat oxidation thereof using energy beam irradiation to form the gate insulator, the variety of threshold voltage value (Vth) of thin film semiconductor device can be greatly reduced (to the degree of less than 0.1 V) compared with conventional devices. Also, the stability of threshold value related to contamination of gate insulator or channel boundaries is greatly improved to such degree that the shift amount of Vth after 10,000 hours operation is reduced to less than 0.05 V.

These improvements appear to occur because the oxidized insulation film has a solid and minute character similar to that of a heat-oxidized silicon film, due to its high-heat formation process including a melting step. For example, the disclosed oxidized film has properties similar to that of high-temperature heat-oxidized silicon film in the value of flat band voltage obtain by leak current measurement or C-V measurement, or in the shift amount of threshold value in bias temperature stress estimation (BTS). Further, the disclosed oxidized film layer, not withstanding its thin character, can fully protect the single-crystalline silicon layer and does not contribute to breakdown.

It is possible to omit to set the electrode on some predetermined grains of single-crystalline, or to set plural electric circuits to one single crystalline grain, if necessary. It is noted that the process described above corresponds to a process for the formation of N-channel thin film transistors. This process also can be used for the formation of P channel transistors by successive implantation of impurities for the formation of P channel transistors using partial masking means. Furthermore, it is possible to use the second control layer as an accumulated gate insulator directly, or to use only the insulating oxidized film as the gate insulating layer after making etching-treatment. To reduce leakage current that may occur among adjacent transistors, island separations can be made by etching after or before the crystallization.

IMPLEMENTATION EXAMPLES

On the surface of non-alkali glass sheet, manufactured by Corning Glass Works, with the outside dimension of 400× 500 mm, a thickness of 0.7 mm and a strain point of 650° C., a layer of silicon oxide (SiO2) with thickness of 200 nm was deposited by the method of plasma CVD, as the first control layer for heat-conduction and crystallization. Then, a layer of amorphous silicon (a-Si:H) with thickness of 60 nm was deposited without being exposed to the atmosphere. Next, this layer of amorphous semiconductor was annealed, and after dehydrogenating it, the surface area of the layer is formed as an oxygen-implanted area by implantation of oxygen ion. The implantation of oxygen ion was carried out with the accelerated voltage of 3 keV, and the dose amount of 1.5E17/$cm^2$. Under these conditions, the position of the maximum oxygen density was at the depth of about 10 nm corresponding to ion projection range (Rp), and the maximum density of oxygen was 1E23/$cm^3$.

As stated in the foregoing, the implanting amount of oxygen (dose amount) or the implanting depth of oxygen (Rp) is determined by the thickness of insulating oxidized layer and its position to be formed. In the present example, the above implantation conditions were determined from the viewpoint for forming an insulation oxidized layer of about 30 nm thicknesses on the surface of a layer of single-crystalline semiconductor.

Sequentially, pulsated laser beam were irradiated to the substrate sheet from its upper-side, whereby the amorphous silicon layer was crystallized and the oxygen implanted layer was converted to an oxidized layer. The irradiation was carried out in a mode that one unit of laser has a square size irradiation face of 5 mm×5 mm in which 250,000 maximum intensity points and minimum intensity points are arranged with intervals of 10 μm in a square lattice form, by using a phase shift mark for distributing the irradiation strength. In this embodiment, the melting threshold value (Emth) was about 0.6 J/cm$^2$, the maximum energy strength of laser beam (Emax) being 1.9 J/cm$^2$ and minimum strength value (Emin) being 0.1 J/cm$^2$.

By the irradiation process, the layer of amorphous silicon of 60 nm thickness was converted to a layer comprising a crystalline silicon layer of about 50 nm thickness and an oxidized layer of about 30 nm thickness. Implanted oxygen ion of dose amount of 1.5 E17/cm$^2$ is reacted with silicon atoms equivalent to silicon layer of 20 nm thickness, and formed a silicon oxide layer of about 30 nm thickness.

The irradiation by excimer laser in this process was carried out over the whole surface of the sheet by shifting the irradiation face stepwise at the intervals of 5 mm. After finishing the irradiation, a Secco-etching treatment was made. As the result of observation by a scanning-type electronic microscope, it was found that a substrate for thin film semiconductor device, in which one million numbers of single-crystalline grains of average size of 4.5 μm were arranged regularly in the lattice form in every square areas of 5×5 mm.

Next, a molybdenum/tungsten alloy layer is deposited by a sputtering process, and gate electrodes were formed by patterning the layer to predetermined shapes while adjusting its position so as to corresponding to the position of single-crystalline grains. Then, by implanting phosphorous ions using the gate electrodes as the mask, source electrodes and drain electrodes were formed. Then, layers of silicon oxide were deposited by a plasma CVD process for forming an insulator. After perforating contact holes in insulator positions corresponding to source areas and drain areas, aluminum layers are deposited and patterned thereon, thereby completed a thin film transistor (TFT). This device acted with N-channel operation, showing the threshold voltage (Vth) of 1.2 V and the mobility of 496 cm$^2$/V·sec. When thin film transistors were formed on a thin film semiconductor substrate sheet of 400 mm×500 mm size, threshold values thereof were 1.2 V±0.08V and the mobility were 496±56 cm2/V·sec. In a BTS estimation of 10,000 seconds, shifting values were only 0.05V.

The following is another example, in which the insulating oxidized film layer is embedded into the film of single-crystalline silicon grains.

On the surface of base layer of non alkali glass manufactured by Corning Glass Works, having the dimension of 400 mm×500 mm, a thickness of 0.7 mm, and a strain point of 650° C., an oxidized silicon (SiO$^2$) film of 200 nm thickness is formed by plasma CVD method as the first control layer for heat conduction and crystallization. Then, a layer of amorphous silicon (a-Si:H) of 110 nm thickness is formed without exposing to the atmosphere.

The layer of amorphous silicon oxide was annealed and dehydrogenated. Then, oxygen ions were implanted into the intermediate region in the thickness direction in order to form an oxygen implanted area. The implantation of oxygen ions was carried out with the accelerated voltage of 20 keV and the dose amount of 1.5E17/cm$^2$. Under these conditions, the maximum oxygen density point of 3E22/cm$^3$ was positioned in the depth of about 50 nm corresponding to the projection range of oxygen ions. The above conditions for formation of the implantation area were determined for the purpose of forming an insulating oxidized layer of about 30 nm thickness in the depth of about 60 nm (central depth) from the surface of the single-crystalline grains layer.

Then, the pulsated excimer laser beam was used to irradiate the layer from the upper direction, whereby the amorphous silicon layer was crystallized and the oxygen implanted areas were converted to oxidized areas. The irradiation by laser was carried out with the irradiation intensity distribution by using a phase shifting mask so that a total of 250,000 maximum intensity points and minimum intensity points were formed arranged within a square lattice formed at intervals of 10 μm in one unit of irradiated face of 5 mm×5 mm. In this example, melting threshold value (Eth) was about 0.8 J/cm$^2$, the maximum value of energy intensity (Emax) was 2.3 J/cm$^2$ and the minimum intensity value was 0.1 J/cm$^2$. By the above irradiation, the amorphous silicon layer of 110 nm thickness was changed to three layers, namely, the second single-crystalline silicon grains layer at the top area with 45 nm thickness, the oxidized silicon layer of about 30 nm at the intermediate area and the first single-crystalline grains layer of about 50 nm at the bottom area.

Next, the second single crystalline silicon layer 55 was formed as a gate electrode by patterning, and a source area and drain area were formed by implanting phosphorous ions using the gate electrode as a mask. Following this, a silicon oxide layer was deposited as an insulator using a plasma CVD deposition method, and contact holes were formed in the insulator at the position above the source and drain areas. The thin film transistor (TFT) is then completed by depositing aluminum and patterning it. This process results in a N channel device with a threshold voltage value (Vth) of 1.0V and an electron mobility of 475 cm$^2$/V·sec.

The threshold values of 20 numbers of thin film transistors, each of which was formed on the thin film semiconductor base layer of 400 nm×500 nm, were 1.0±0.08 V, and the mobilities thereof were 475±50 cm$^2$/V·sec. Furthermore, by the BTS estimation of 10,000 seconds, shift amount of Vth was only 0.05 V.

A number of embodiments of the present invention have been described. Nevertheless, it will be understood that various modifications may be made without departing from the spirit and scope of the invention. For example, while in the above examples the oxidize layer is formed by implanting oxygen ion, the layer can be formed by further introducing other ions such as nitrogen ion. Accordingly, other embodiments are within the scope of the following claims.

The invention claimed is:

1. A method for producing a substrate sheet for thin film semiconductor devices comprising steps of;
 (a) depositing a layer of non-single-crystalline semiconductor on a base layer of insulation materials,
 (b) forming oxygen implanted areas in the layer of non-single-crystalline by implanting oxygen ion into the layer, and
 (c) irradiating the layer of non-single-crystalline semiconductor with energy beam by one step irradiation, thereby changing the layer of non-single-crystalline semiconductor so that the oxygen implanted areas are converted to insulating oxidized films and other areas are converted to films of semiconductor crystal grains in which a plurality of single-crystal grains are arranged in a two-dimensionally regulated mode, and the irradiation of energy beam is carried out so that an area to which an irradiation intensity of maximum value, which is sufficient to melt the non-single-crystalline semiconductor, is given and an area to which an irradiation intensity of minimum value, which does not cause the melt of the non-single-crystalline semiconductor, is given are arranged in a two-dimensionally regulated mode and the transition of irradiation intensity between the above two areas are successive, being interposed with a melting threshold level.

2. A method for producing a substrate sheet for thin film semiconductor devices of claim 1, wherein the oxygen implanted area is formed in a top layer portion of non-single-crystalline semiconductor layer.

3. A method for producing a substrate sheet for thin film semiconductor devices of claim 1, wherein the oxygen implanted area is formed in an intermediate layer portion of non-single-crystalline semiconductor layer.

4. A method for producing a thin film semiconductor devices comprising steps of,
   (a) depositing a layer of non-single-crystalline semiconductor on a base layer of insulation materials,
   (b) forming oxygen implanted areas in the layer of non-single-crystalline semiconductor by implanting oxygen ion into the layer,
   (c) irradiating the layer of non-single-crystalline with energy beam by one step irradiation, thereby changing the layer of non-single -crystalline semiconductor so that the oxygen implanted areas are converted to an at least one insulation oxidized film and other areas are converted to films of semiconductor crystal grains in which a plurality of single-crystal grains are arranged in a two-dimensionally regulated mode, and the irradiation of energy beam is carried out so that the area to which the irradiation intensity of maximum value is given and the area to which the irradiation intensity of minimum value is given are arranged in a two-dimensionally regulated mode and the transition of irradiation intensity between the above two areas are successive, being interposed with a melting threshold level,
   (d) forming a gate electrode by patterning the films of semiconductor crystal grains and using the insulating oxidized film as a gate insulator and,
   (e) completing an electric circuit unit by forming a source electrode and a drain electrode in the films of semiconductor crystal grains in which a plurality of single-crystal grains are arranged in a two-dimensionally regulated mode.

5. A method for producing a thin film semiconductor device of claim 4, wherein the at least one insulation oxidized films are formed at the top layer portion of the films of semiconductor crystal grains and, the resulted at least one insulation oxidized films are used as a gate insulator and a source electrode and a drain electrode are formed in a lower layer portion of the films of semiconductor crystal grains.

6. A method for producing a thin film semiconductor device of claim 4, wherein the at least one insulation oxidized films are formed in an intermediate layer portion of the films of semiconductor crystal grains and, the resulted at least one insulation oxidized films are used as the gate insulation and the source electrode and the drain electrode are formed in the lowest layer portion of the films of semiconductor crystal grains.

* * * * *